United States Patent
Perng et al.

(10) Patent No.: US 7,826,193 B2
(45) Date of Patent: Nov. 2, 2010

(54) STRING CONTACT STRUCTURE FOR HIGH VOLTAGE ESD

(75) Inventors: Dah-Jyh Perng, Hsinchu (TW);
Shui-Hung Chen, Hsinchu (TW);
Jian-Hsing Lee, Hsin-Chu (TW);
Huang Yung-Sheng, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 841 days.

(21) Appl. No.: 11/585,011

(22) Filed: Oct. 23, 2006

(65) Prior Publication Data

US 2008/0093672 A1     Apr. 24, 2008

(51) Int. Cl.
*H02H 9/00* (2006.01)

(52) U.S. Cl. .......... 361/111; 257/355; 257/358
(58) Field of Classification Search ........ 361/111; 257/355, 358, E21.356, E21.388
See application file for complete search history.

*Primary Examiner*—Michael B Shingleton
(74) *Attorney, Agent, or Firm*—K&L Gates LLP

(57) ABSTRACT

The present invention relates to an electrostatic discharge (ESD) protection scheme and particularly to a string contact structure for an improved ESD performance. In an embodiment, the invention provides a method for forming an ESD protection circuit for protecting an internal circuit from damage due to an ESD voltage appearing on a pad coupled to a clamp device including a first terminal and a second terminal. The method includes forming a string contact along the first terminal and the second terminal of the clamp device. The method further includes forming one or more conductive layers on the string contact to couple the first terminal and the second terminal of the clamp device to the pad and a ground pad.

9 Claims, 6 Drawing Sheets

STRING CONTACT STRUCTURE FOR HIGH VOLTAGE ESD

BACKGROUND OF THE INVENTION

The present invention generally relates to an electrostatic discharge (ESD) protection scheme, and particularly to a string contact structure for an improved ESD performance.

Electrostatic discharge (ESD) is the sudden and momentary electric current that flows when an excess of electric charge, stored on an electrically insulated object, finds a path to an object at a different electrical potential such as ground. When a static charge moves in an integrated circuit (IC), it becomes a current that damages or destroys gate oxide, metallization, and junctions. ESD can occur when a charged body touches an IC, a charged IC touches a grounded surface, or a charged machine touches an IC.

ESD is a common phenomenon that occurs during the handling of semiconductor devices. Electrostatic charges may accumulate and cause potentially destructive effects on a semiconductor IC device. ESD stress can occur during a testing phase of IC fabrication, during installation of the IC onto a circuit board, as well as during use of equipment in which the IC has been installed. ESD damage to a single IC in an electronic device can partially or sometimes completely stop its operation.

As technology advances, ESD durability has become an increasing concern for IC manufacture. As semiconductor processing technology has advanced into deep submicron regimes, the resulting scaled-down semiconductor devices including shallower junction depth and thinner gate oxide layers are less tolerant to ESD stress. Therefore, ESD protection circuits must be implemented at the I/O pads of the IC to prevent damage from ESD stress.

Generally, damage to a device by the ESD event is determined by the device's ability to dissipate the energy of the discharge or withstand the current levels involved. This is known as device "ESD sensitivity" or "ESD susceptibility." Standard tests have been developed to enhance the quality and reliability of ICs, thereby minimizing the detrimental effects of ESD.

These test procedures are based on the three primary models of ESD events, namely, human body model (HBM), machine model (MM), and charged device model (CDM). The models used to perform component testing cannot replicate the full spectrum of all possible ESD events. Nevertheless, these models have been proven to be successful in reproducing over 95% of all ESD field failure signatures. Some devices may be more easily damaged by discharges occurring within the automated equipment, while others may be more prone to damage from handling by personnel.

One of the most common causes of electrostatic damage is the direct transfer of electrostatic charge from the human body or from a charged material to the ESD sensitive device. When a person walks across a floor, an electrostatic charge accumulates on his body. Simple contact of a finger to the leads of the ESD sensitive device allows the body to discharge, possibly causing device damage. The model used to simulate this event is the human body model (HBM).

The human body model is the most commonly used model for classifying device sensitivity to ESD. The human body testing model represents the discharge from the fingertip of a standing individual delivered to the device. It is modeled by a capacitor discharged through a switching component and a series resistor into the component. A further description will be made with reference to FIG. 4.

A discharge similar to the HBM event can also occur from a charged conductive object, such as a metallic tool or fixture. This model is known as the machine model (MM). The machine model consists of a 200 pF capacitor discharged directly into a component with no series resistor. As a worst-case human body model, the machine model may be overly severe. However, there are real-world situations that this model represents, for example the rapid discharge from a charged board assembly or from the charged cables of an automatic tester. The same test equipment is used as for the HBM testing, but the test head is slightly different. The MM version does not have a series resistor, but otherwise the test board and the socket are the same as for HBM testing.

Traditionally, a contact array having a plurality of contact holes as shown in FIG. 2A has been used to form a high voltage ESD protection circuit. However, such contact array often produces localized contact damage as visually observed by hot spots or a scanning electron microscope (SEM) analysis. A cross-sectional SEM analysis shows that only one or two contacts are often damaged in a contact array, which is believed to be caused by a non-uniform ESD current flow or distribution within the contact array when ESD zaps are applied to the device under ESD test. If this happens, ESD performance will be degraded.

As such, it is desirable to devise a new ESD contact structure where no localized contact failure occurs as observed in the conventional contact array, such that an improved ESD performance can be obtained.

BRIEF SUMMARY OF THE INVENTION

The present invention generally relates to an electrostatic discharge (ESD) protection scheme, and particularly to a string contact structure for an improved ESD performance. Merely by way of example, the invention has been applied to an ESD protection circuit. However, it would be recognized that the invention has a much broader range of application as well.

In a specific embodiment, a method for forming an ESD protection circuit for protecting an internal circuit from damage due to an ESD voltage appearing on a pad is disclosed. The pad being coupled to a clamp device includes a first terminal and a second terminal. The method includes forming a string contact along the first terminal and the second terminal of the clamp device. The method further includes forming one or more conductive layers on the string contact to couple the first terminal and the second terminal of the clamp device to the pad and a ground pad.

In another embodiment, the present invention provides an electrostatic discharge (ESD) protection apparatus for protecting an internal circuit from damage due to an ESD voltage appearing on a pad. The apparatus includes a clamp means for clamping the ESD voltage and allowing a high ESD current to be discharged to a ground pad, the clamp means including a first terminal and a second terminal. The apparatus further includes a string contact formed along the first terminal and second terminal, wherein the first terminal is coupled to the pad and the second terminal is coupled to the ground pad by one or more conductive layers through the string contact.

One of the advantages of the new string contact structure over the conventional contact array is that ESD performance is improved because the string contact structure can stand a much higher ESD current than the conventional contact array without major process change. Another advantage is that the present invention provides an improved ESD performance because the string contact structure provides a more uniform current distribution within the contact structure, thereby no localized contact failure occurs.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
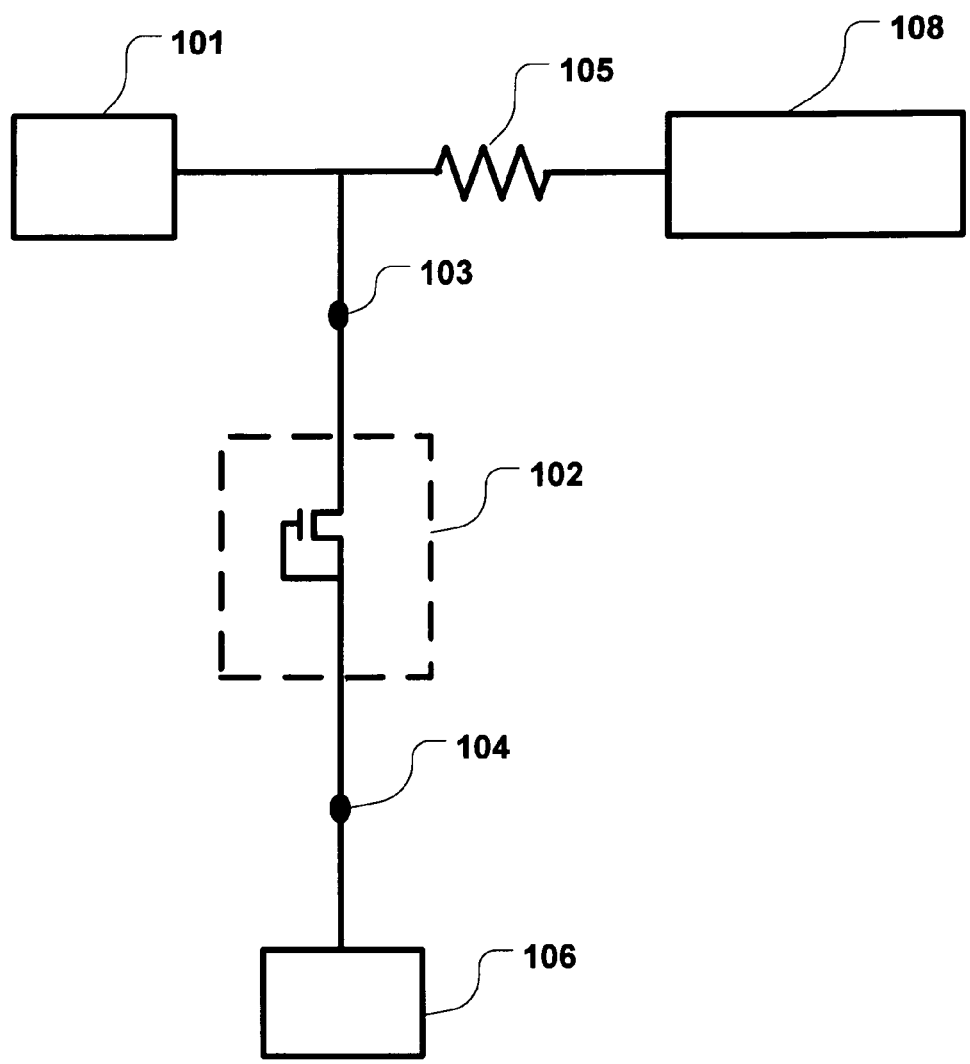
FIG. 1 is a simplified schematic showing an electrostatic discharge (ESD) protection system.

FIG. 1 is a simplified schematic showing an ESD protection system. The pad 101 may be an input/output (I/O) pad or a power supply (Vdd) pad. A clamp device 102 is connected between the pad 101 and a ground (GND) pad 106 to protect the internal circuit 108 from the ESD voltage appearing on the pad 101. The clamp device 102 is the primary ESD protection device that protects against ESD surges at the I/O pad by clamping the voltage and allowing the high ESD current to be discharged safely to the ground terminal 106.

An example of the clamp device is a diode chain consisting of one or more diodes connected in series or a grounded-gate NMOS (GGNMOS) transistor having a gate terminal, a source terminal, and a drain terminal. The clamp device including the diode chain, GGNMOS transistor, or the combination thereof is typically coupled in parallel to a protected device or an internal circuit 108, between the I/O pad 101 and a ground pad 106. The clamp device 102 is designed to be triggered on before the ESD current damages the protected internal circuit 108. Resistor 105 may be used to further limit current to the internal circuit 108 for additional protection.

If the clamp device is made of a GGNMOS transistor, its drain junction and source junction are coupled to the pad 101 and the ground pad 106 respectively through the contact holes formed on the drain terminal or a first terminal 103, and the source terminal or a second terminal 104 using one or more conductive layers like aluminum or doped polysilicon for electrical connection. If the clamp device is made of one or more diodes connected in series, the anode and cathode terminals thereof are coupled to the pad 101 and the ground pad 106 respectively through the contact holes formed along the first terminal 103 and the second terminal 104 using the conductive layers as described above.

Figure 2A:
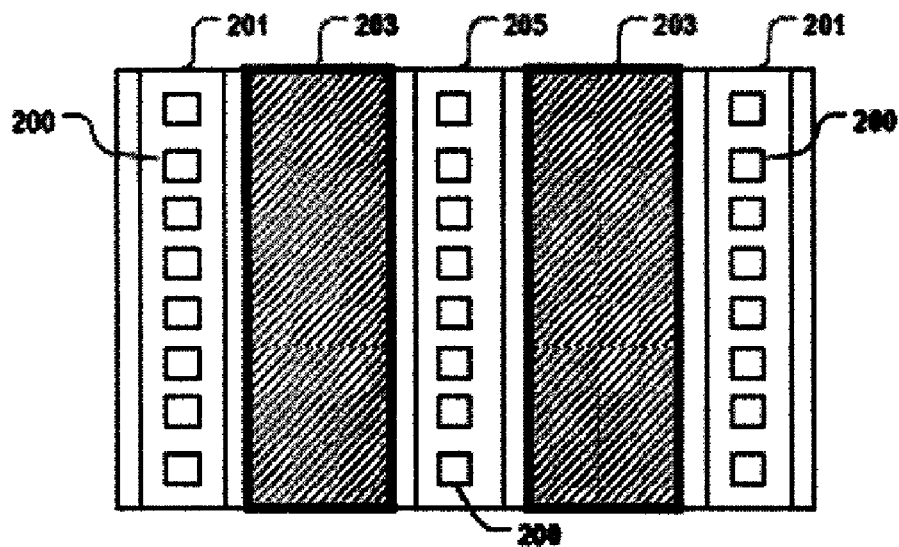
FIG. 2A is a simplified plan view showing a conventional contact array having a plurality of contacts with small contact spacing.

FIG. 2A is a simplified plan view showing a conventional contact array having a plurality of contacts with small contact spacing. The spacing between each contact 200 is smaller than the minimum contact spacing defined by a design rule. Referring to FIGS. 1 and 2A, the contact array 205 illustrates a plurality of contact holes 200 formed along the drain terminal of the GGNMOS transistor 102, such that an electrical contact between the first terminal 103 of the GGNMOS transistor or the clamp device 102 and the pad 101 can be made. The contact arrays 201 show a plurality of contact holes 200 formed along the source terminals of the GGNMOS transistor 102, such that an electrical contact between the second terminal 104 of the GGNMOS transistor or the clamp device 102 and the ground pad 106 can be made. Each contact hole 200 has a smaller contact spacing than that of the given design rule.

Figure 2B:
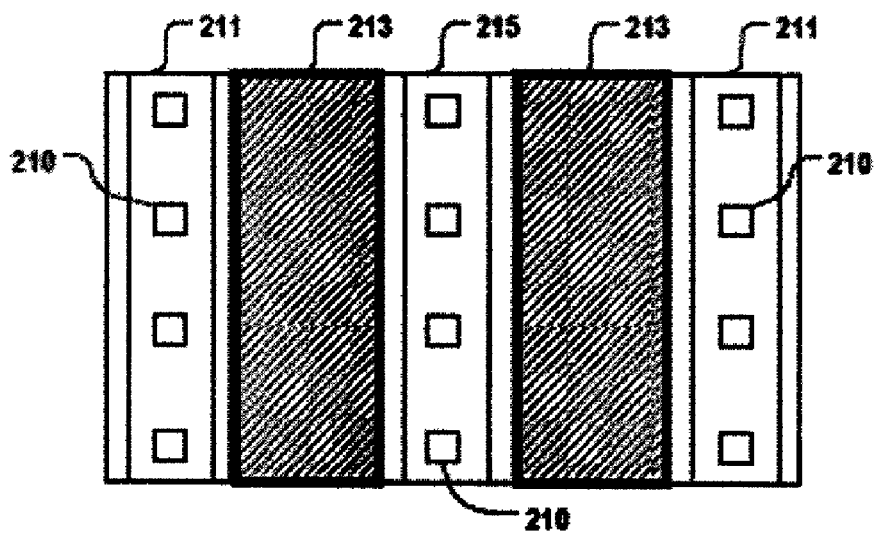
FIG. 2B is a simplified plan view showing a conventional contact array having a plurality of contacts with large contact spacing.

FIG. 2B is a simplified plan view showing a conventional contact array having a plurality of contacts with large contact spacing. The spacing between two neighboring contacts 210 is larger than the maximum contact spacing defined by a design rule. Referring to FIGS. 1 and 2B, the contact array 215 illustrates a plurality of contact holes 210 formed along the drain terminal of the GGNMOS transistor, such that an electrical contact between the first terminal 103 of the clamp device 102 and the pad 101 can be made. Likewise, the contact arrays 211 are formed along the source terminals of the clamp device 102, such that an electrical contact between the second terminal 104 of the clamp device 102 and the ground pad 106 can be made. Each contact hole 210 has a larger contact spacing than that of the given design rule.

Since the ESD can have serious detrimental effects on all semiconductor ICs and the system that contains them, standard tests including the human body model sensitivity test are typically performed using an automated test system. The device under test is placed in the test system and contacted through a relay matrix. ESD zaps are then applied and the post stress I-V current traces are reviewed to see if the devices fail. Different ESD models tend to produce different types of failure and require different types of control and protection schemes. Basic failure mechanisms include oxide punch-through, junction burnout, metalization burnout, etc.

One common failure mechanism observed in the conventional contact array structures shown in FIGS. 2A and 2B is that only one or two contacts are damaged out of a plurality of contacts within the contact array after ESD zaps are applied. This indicates that the ESD current discharged through the contact array is not uniform, thereby resulting in degraded ESD performance and ESD-induced defects.

Figure 3:
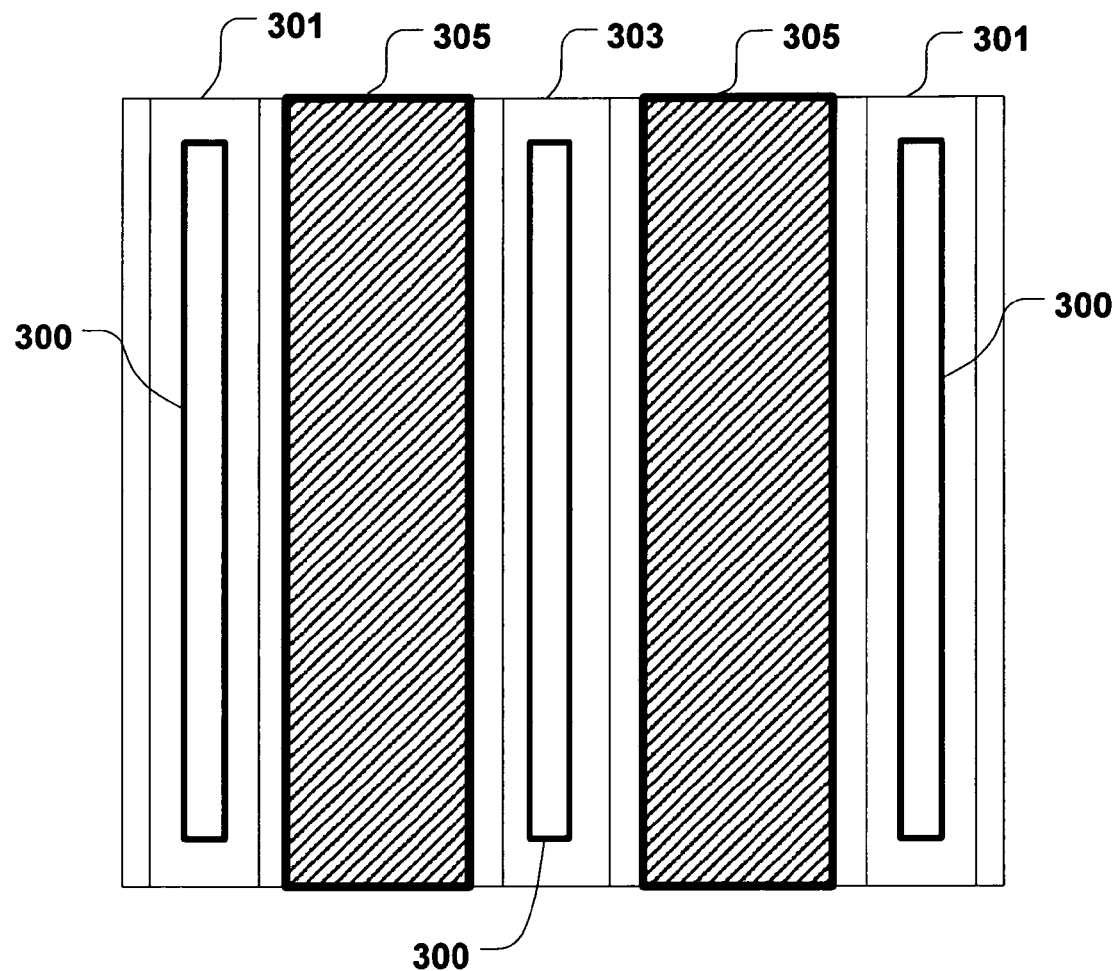
FIG. 3 is a simplified plan view showing a string contact formed along the source and drain terminals of a grounded-gate NMOS (GGNMOS) transistor according to an embodiment of the present invention.

FIG. 3 is a simplified plan view showing a string contact formed along the source and drain terminals of the grounded-gate NMOS (GGNMOS) transistor according to an embodiment of the present invention. Referring to FIGS. 1 and 3, if the clamp device 102 is made of a GGNOS transistor, the source and drain contacts for the GGNMOS transistor can be made of a string contact 300. The string contact 300 is a single continuous contact hole formed along the source terminal 301 and the drain terminal 303 of the GGNMOS transistor. The contact array 303 comprises only a single string contact 300, through which an electrical connection between the first terminal or drain terminal 103 of the GGNMOS transistor and the pad 101 can be made, while the contact arrays 301 are formed along the source terminals of the GGNMOS transistor using the string contact 300 to provides an electrical connection between the second terminal or source terminal of the GGNMOS transistor and the ground pad 106.

Figure 4:
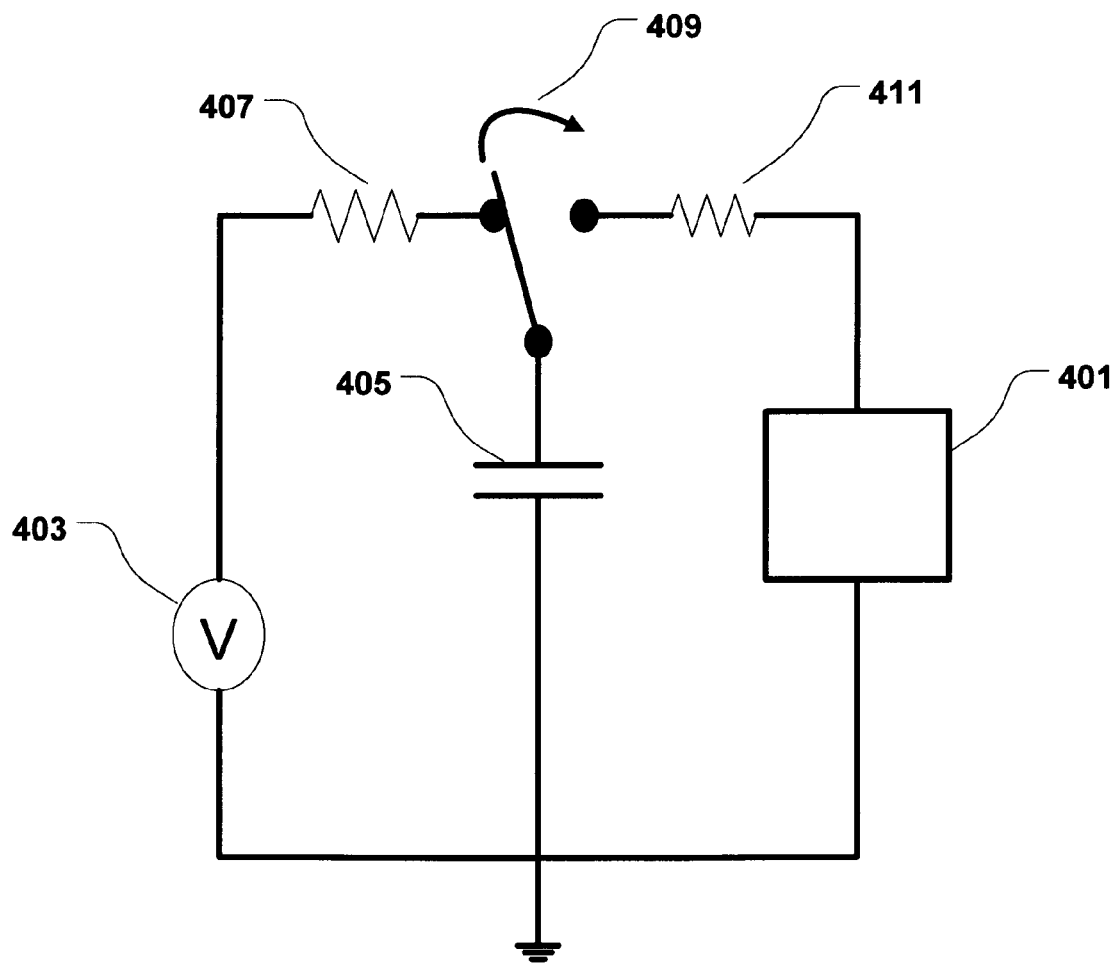
FIG. 4 is a simplified schematic showing a typical human body model (HBM) test circuit.

FIG. 4 is a simplified schematic showing a typical human body model (HBM) test circuit. As briefly described above, the HBM represents the discharge from the fingertip of an individual delivered to the device. It is modeled by a capacitor 405 (100 pF), which is charged by the supply voltage 403 through a resistor 407, and then discharged through a switching component 409 and a series resistor 411 (1.5 kohms) into the ESD sensitive device 401. The device under test 401 is placed in the test system and contacted through a relay matrix (not shown). ESD zaps are applied and the post stress I-V current traces are reviewed to see if the device fails. Testing for MM sensitivity is performed using a test system (not shown here) comprising a 200 pF capacitor discharged directly into a device under test with no series resistor (1.5 Kohms). The MM test board and the socket are the same as for HBM testing.

Figure 5:
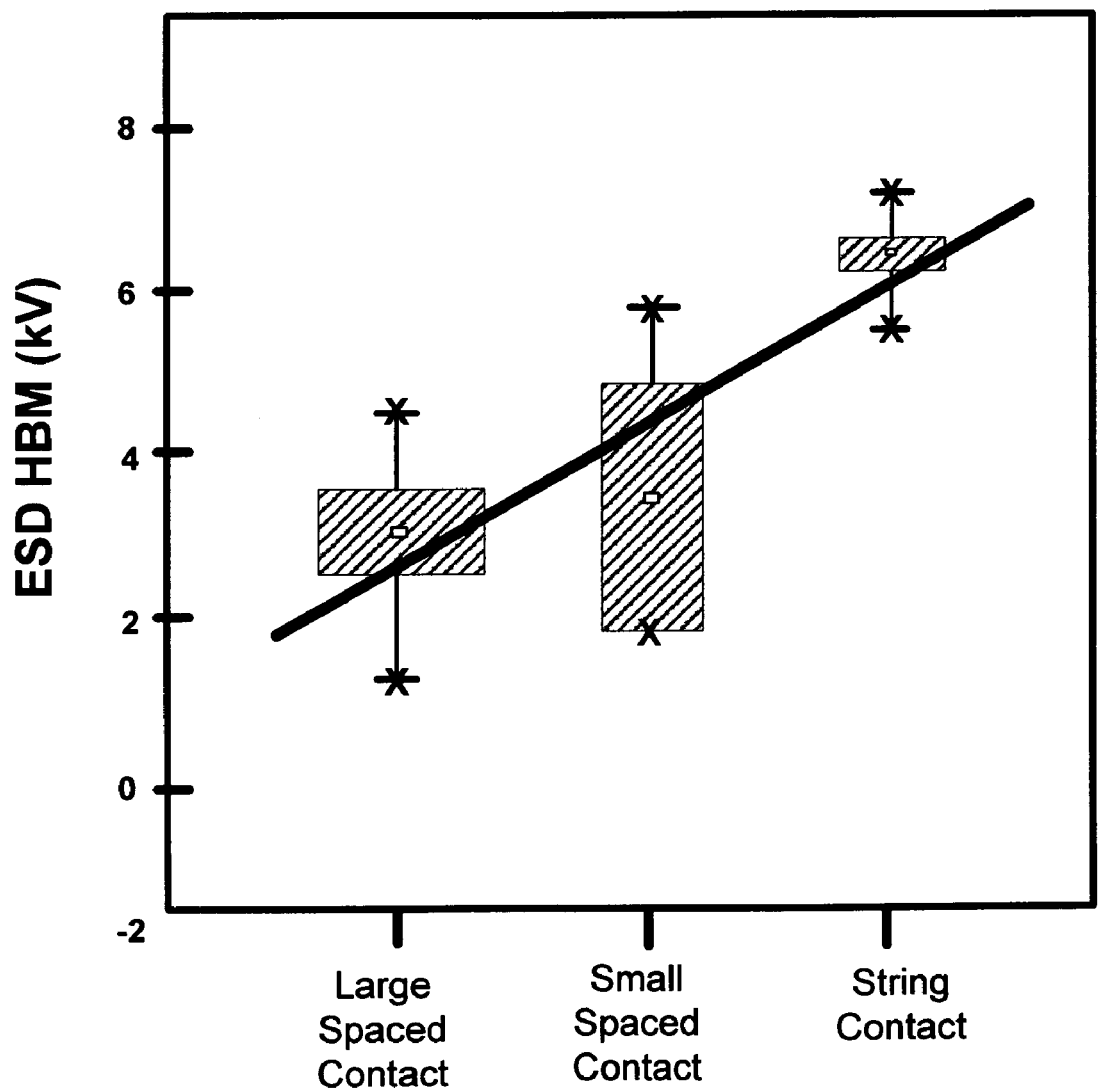
FIG. 5 is a graph showing the ESD HBM test results for the ESD protection system employing various contact structures including a string contact structure in accordance with an embodiment of the present invention.

FIG. 5 is a graph showing the ESD HBM test results for the ESD protection system employing various contact structures including a string contact structure in accordance with an embodiment of the present invention. The X-axis represents the contact structures including a large spaced contact, a small spaced contact, and also a string contact formed in accordance with an embodiment of the present invention. The Y-axis represents ESD voltages that the device subject to the HBM ESD test can tolerate. Although the data points are spread between 1.25 kV and 6 kV, the string contact structure shows a higher average ESD voltage endurance than that of the conventional contact structures.

Figure 6:
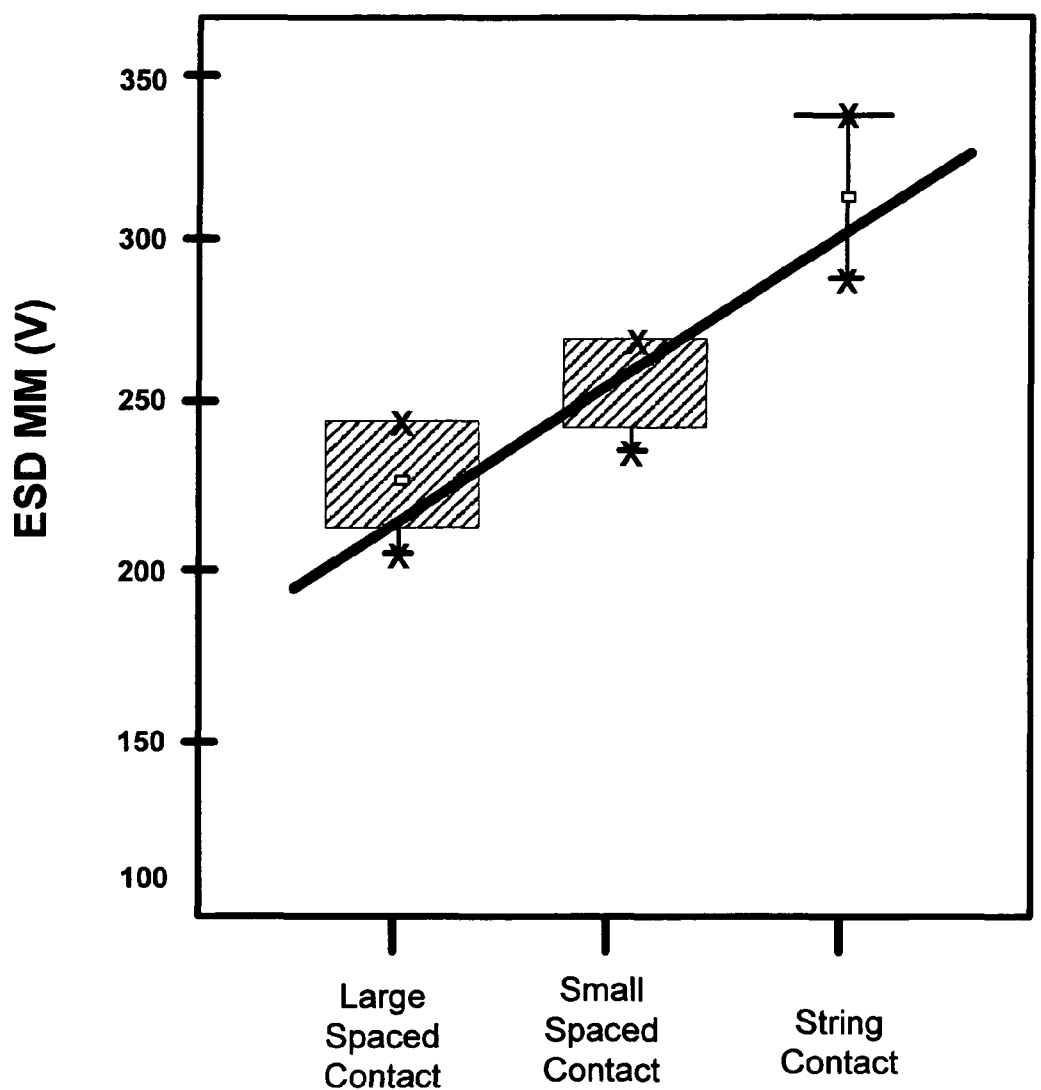
FIG. 6 is a graph showing the ESD MM test results for the ESD protection system employing various contact structures including a string contact structure in accordance with an embodiment of the present invention.

FIG. 6 is a graph showing the ESD machine model test results for the ESD protection system employing various contact structures including a string contact structure in accordance with an embodiment of the present invention. The X-axis represents the contact structures including a large spaced contact, a small spaced contact, and also a string contact formed in accordance with an embodiment of the present invention. As in FIG. 5, the Y-axis of FIG. 6 represents ESD voltages that the device subject to the MM ESD test can tolerate. As FIG. 6 shows, although the data points are spread between 200V and 350V, the string contact structure generally shows a higher ESD voltage endurance than the conventional contact structures.

It is known to those in the art that different ESD models tend to produce different types of failure mechanisms after an ESD stress is applied. For example, a drain-junction damage in an NMOS transistor is usually observed after HBM ESD stress is applied. A scanning electron microscope (SEM) or other microscopic analysis indicates that only one contact or two is damaged within a conventional contact array after ESD zapping is applied. As stated above, this means that the ESD current distribution within the conventional contact array is non-uniform, thereby resulting in lower ESD voltages. The above ESD test results and SEM analysis indicate that the string contact structure can discharge a much higher ESD current in a uniform manner than the conventional contact structure.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An ESD protection apparatus connected to a pad for protecting an internal circuit from damage due to an ESD voltage appearing on the pad, the apparatus comprising:
   a ground pad; and
   a clamp means connected between the pad and the ground pad for clamping the ESD voltage and allowing a high ESD current to be discharged to the ground pad, the clamp means including a first terminal and a second terminal,
   wherein the clamp means further includes a set of string contacts for an electrical connection between the first terminal and second terminal, each of the string contacts having a short side defined by a given design rule and a long side being substantially longer than the short side for discharging the high ESD current to the ground pad in a uniform manner to prevent a localized contact damage,
   wherein the first terminal is coupled to the pad and the second terminal is coupled to the ground pad by one or more conductive layers through the string contact.

2. The ESD protection apparatus of claim 1, wherein the electrical connection between the first terminal and the pad or between the second terminal and the ground pad is made through the string contact.

3. The ESD protection apparatus of claim 1, wherein the pad is a power supply pad.

4. The ESD protection apparatus of claim 1, wherein the clamp device is a primary ESD protection device comprising one or more diodes connected in series.

5. The ESD protection apparatus of claim 1, wherein the clamp device comprises at least one grounded-gate NMOS transistor having a drain terminal coupled to the pad and a source terminal coupled to the ground pad.

6. The ESD protection apparatus of claim 5, wherein the clamp device further comprises at least one or more diodes serially connected between the pad and the ground pad.

7. The ESD protection apparatus of claim 1, wherein the conductive layer is an aluminum layer.

8. The ESD protection apparatus of claim 1, wherein the conductive layer is a polysilicon layer.

9. The ESD protection apparatus of claim 1, wherein the conductive layer is a semiconductor layer heavily doped by n-type impurity ions.

* * * * *